United States Patent
Sakakura et al.

(10) Patent No.: US 11,041,921 B2
(45) Date of Patent: Jun. 22, 2021

(54) MRI APPARATUS, IMAGE PROCESSING APPARATUS, AND MRI METHOD

(71) Applicant: CANON MEDICAL SYSTEMS CORPORATION, Otawara (JP)

(72) Inventors: Yoshitomo Sakakura, Nasushiobara (JP); Hidekazu Tanaka, Nasushiobara (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 0 days.

(21) Appl. No.: 16/693,448

(22) Filed: Nov. 25, 2019

(65) Prior Publication Data
US 2020/0174088 A1 Jun. 4, 2020

(30) Foreign Application Priority Data
Nov. 29, 2018 (JP) .............................. JP2018-223227
Nov. 12, 2019 (JP) .............................. JP2019-204407

(51) Int. Cl.
*G01R 33/385* (2006.01)
*G01R 33/565* (2006.01)
*G01R 33/58* (2006.01)

(52) U.S. Cl.
CPC ..... *G01R 33/385* (2013.01); *G01R 33/56572* (2013.01); *G01R 33/58* (2013.01); *G06T 2207/10088* (2013.01)

(58) Field of Classification Search
CPC ............ G01R 33/385; G01R 33/56572; G01R 33/58; G06T 2207/10088
See application file for complete search history.

(56) References Cited

U.S. PATENT DOCUMENTS

| | | | | |
|---|---|---|---|---|
| 4,591,789 | A * | 5/1986 | Glover | G01R 33/56518 324/307 |
| 4,672,320 | A * | 6/1987 | Sekihara | G01R 33/56563 324/309 |
| 7,782,054 | B2 * | 8/2010 | Werthner | G01R 33/56563 324/309 |
| 2005/0024051 | A1 * | 2/2005 | Doddrell | A61B 5/7257 324/307 |

(Continued)

FOREIGN PATENT DOCUMENTS

JP 2009-226199 A 10/2009

*Primary Examiner* — G. M. A Hyder
(74) *Attorney, Agent, or Firm* — Oblon, McClelland, Maier & Neustadt, L.L.P.

(57) ABSTRACT

In one embodiment, an MRI apparatus includes: a scanner that is provided with at least an RF coil and a gradient coil and is configured to acquire a magnetic resonance (MR) signal emitted from an object in response to applications of an RF pulse outputted from the RF coil and a gradient magnetic field generated by the gradient coli; and processing circuitry configured to reconstruct a diagnostic image of the object based on the MR signal, generate distortion correction data for correcting a non-linear characteristic of the gradient magnetic field to a linear characteristic that is defined by gradient magnetic field strength at a correction position away from a magnetic field center of the gradient coil and distance from the magnetic field center to the correction position, and correct the diagnostic image by using the distortion correction data.

13 Claims, 13 Drawing Sheets

(56) References Cited

U.S. PATENT DOCUMENTS

2006/0012365 A1* 1/2006 Werthner ......... G01R 33/56518
 324/307
2009/0146657 A1* 6/2009 Hebrank .......... G01R 33/56518
 324/307

* cited by examiner and MRI METHOD

CROSS-REFERENCE TO RELATED APPLICATIONS

This application is based upon and claims the benefit of priority from Japanese Patent Application No. 2018-223227, filed on Nov. 29, 2018, and Japanese Patent Application No. 2019-204407, filed on Nov. 12, 2019, the entire contents of each of which are incorporated herein by reference.

FIELD

Disclosed embodiments relate to a magnetic resonance imaging (MRI) apparatus, an image processing apparatus, and an MRI method.

BACKGROUND

An MRI apparatus is an imaging apparatus that magnetically excites nuclear spin of an object placed in a static magnetic field by applying a radio frequency (RF) pulse having the Larmor frequency and reconstructs an image on the basis of magnetic resonance (MR) signals emitted from the object due to the excitation.

As is well known, a frequency of an MR signal to be generated from an object is proportional to the magnitude of the magnetic field. An MRI apparatus superimposes a gradient magnetic field, which has strength substantially proportional to the distance from the magnetic field center, on a static magnetic field having spatially uniform strength so as to generate a superimposed magnetic field that has different strength depending on the position.

The MRI apparatus acquires MR signals indicating different frequencies (or different phases) depending on the position of the tissue inside the object by applying this superimposed magnetic field to the object. Further, the MRI apparatus obtains the frequency (or phase) of each of the acquired MR signals and the signal intensity at the obtained frequency (or phase) by reconstruction processing based on, for example, inverse Fourier transform, and then calculates pixel values to be arrayed as a reconstructed image for the respective positions of the tissue inside the object.

In the reconstruction processing using inverse Fourier transform, a frequency of an MR signal is assumed to change in proportion to the position from which this MR signal is emitted, i.e., it is assumed that the frequency and position of each MR signal have a linear relationship.

A gradient magnetic field is generated by, for example, a cylindrical gradient coil. Normally, the gradient magnetic field changes linearly in the vicinity of the axial center of the gradient coil (i.e., in the vicinity of the magnetic field center) but exhibits a non-linear change as the distance from the magnetic field center increases. For this reason, at a position away from the magnetic field center in the reconstructed image, the linear relationship between the frequency and the position of each MR signal is not maintained, and this non-linearity of the gradient magnetic field causes displacement or shift of the pixel position, resulting in image distortion.

In order to suppress such image distortion, a correction table for correcting the non-linearity of the gradient magnetic field has been conventionally used.

Meanwhile, in recent years, demands for increasing gradient magnetic field strength and for increasing a slew rate of a gradient pulse have increased. In order to satisfy these demands under constraints of development costs and physical constraints such as weight and dimensions of the gradient coil, the linear region of the gradient magnetic field has to be narrowed to some extent, due to characteristics of the gradient magnetic field coil itself. Accordingly, there is a demand for a technique that ensures linearity over a wider range than before by using a correction table instead of or in addition to improving the characteristics of the gradient coil itself.

DETAILED DESCRIPTION

A description of embodiments will now be given by referring to the accompanying drawings.

In one embodiment, an MRI apparatus includes: a scanner that is provided with at least an RF coil and a gradient coil and is configured to acquire a magnetic resonance (MR) signal emitted from an object in response to applications of an RF pulse outputted from the RF coil and a gradient magnetic field generated by the gradient coil; and processing circuitry configured to reconstruct a diagnostic image of the object based on the MR signal, generate distortion correction data for correcting a non-linear characteristic of the gradient magnetic field to a linear characteristic that is defined by gradient magnetic field strength at a correction position away from a magnetic field center of the gradient coil and distance from the magnetic field center to the correction position, and correct the diagnostic image by using the distortion correction data.

First Embodiment

Figure 1:
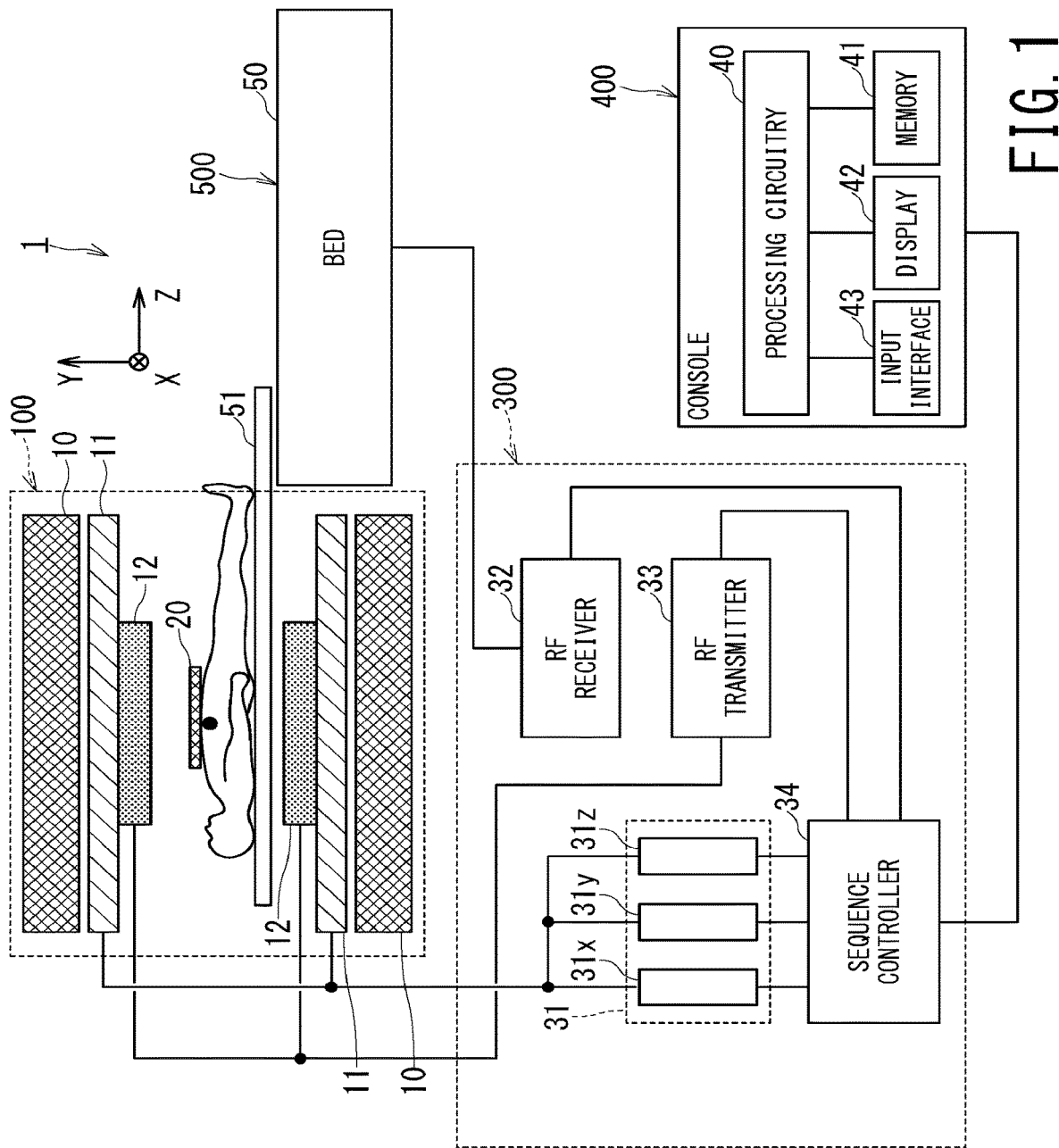
FIG. 1 is a configuration diagram illustrating an overall configuration of an MRI apparatus according to the first embodiment.

FIG. 1 is a block diagram illustrating overall configuration of an MRI apparatus 1 according to the first embodiment. The MRI apparatus 1 includes a gantry 100, a control cabinet 300, a console 400, and a bed 500.

The gantry 100 includes a static magnetic field magnet 10, a gradient coil 11, and a whole body (WB) coil 12, and these components are housed in a cylindrical housing. The bed 500 includes a bed body 50 and a table 51. In addition, the MRI apparatus 1 includes at least one RF coil 20 to be disposed close to the object.

The control cabinet 300 includes three gradient coil power supplies 31 (31x for an X-axis, 31y for a Y-axis, and 31z for a Z-axis), an RF receiver 32, an RF transmitter 33, and a sequence controller 34.

The static magnetic field magnet 10 of the gantry 100 is substantially in the form of a cylinder, and generates a static magnetic field inside a bore, which is a space formed inside the cylindrical structure and serves as an imaging region of the object (for example, a patient). The static magnetic field magnet 10 includes a superconducting coil inside, and the superconducting coil is cooled down to an extremely low temperature by liquid helium. The static magnetic field magnet 10 generates a static magnetic field by supplying the superconducting coil with an electric current to be provided from a static magnetic field power supply (not shown) in an excitation mode. Afterward, the static magnetic field magnet 10 shifts to a permanent current mode, and the static magnetic field power supply is separated. Once it enters the permanent current mode, the static magnetic field magnet 10 continues to generate a strong static magnetic field for a long time, for example, over one year. Note that the static magnetic field magnet 10 may be configured as a permanent magnet.

The gradient coil 11 is also substantially in the form of a cylinder and is fixed to the inside of the static magnetic field magnet 10. The gradient coil 11 has a three-channel structure. Each channel of the gradient coil 11 is supplied with an electric current from the corresponding gradient magnetic field power supply (31x, 31y, or 31z) such that a gradient magnetic field is generated in each of the X-axis, Y-axis, and Z-axis directions.

The bed body 50 of the bed 500 can move the table 51 in the vertical direction and in the horizontal direction. The bed body 50 moves the table 51 with an object placed thereon to a predetermined height before imaging. Afterward, when the object is imaged, the bed body 50 moves the table 51 in the horizontal direction so as to move the object to the inside of the bore.

The WB coil 12 is shaped substantially in the form of a cylinder so as to surround the object, and is fixed to the inside of the gradient coil 11. The WB coil 12 applies RF pulses to be transmitted from the RF transmitter 33 to the object, and receives magnetic resonance (MR) signals emitted from the object due to excitation of hydrogen nuclei.

The RF coil 20 receives MR signals emitted from the object at a position close to the object. The RF coil 20 includes plural coil elements, for example. Depending on the anatomical imaging part of the object, there are various RF coils 20 such as for the head, for the chest, for the spine, for the lower limbs, and for the whole body. Of these various RF coils, FIG. 1 illustrates the RF coil 20 for imaging the chest.

The RF transmitter 33 transmits an RF pulse to the WB coil 12 on the basis of an instruction from the sequence controller 34. The RF receiver 32 detects MR signals received by the WB coil 12 and/or the RF coil 20, and transmits raw data obtained by digitizing the detected MR signals to the sequence controller 34.

The sequence controller 34 performs a scan of the object by driving the gradient coil power supplies 31, the RF transmitter 33, and the RF receiver 32 under the control of the console 400. When the sequence controller 34 receives the raw data from the RF receiver 32 by performing the scan, the sequence controller 34 transmits the received raw data to the console 400.

The sequence controller 34 includes processing circuitry (not shown). This processing circuitry is configured as, for example, a processor for executing predetermined programs or configured as hardware such as a field programmable gate array (FPGA) and an application specific integrated circuit (ASIC).

The console 400 is configured as a computer that includes processing circuitry 40, a memory 41, a display 42, and an input interface 43.

The memory 41 is a recording medium including a read-only memory (ROM) and a random-access memory (RAM) in addition to an external memory device such as a hard disk drive (HDD) and an optical disc device. The memory 41 stores various programs to be executed by a processor of the processing circuitry 40 as well as various data and information.

The display 42 is a display device such as a liquid crystal display panel, a plasma display panel, and an organic EL panel.

The input interface 43 includes various devices for an operator to input various data and information, and is configured of, for example, a mouse, a keyboard, a trackball, and/or a touch panel.

The processing circuitry 40 is, for example, a circuit provided with a central processing unit (CPU) and/or a special-purpose or general-purpose processor. The processor implements various functions described below by executing the programs stored in the memory 41. The processing circuitry 40 may be configured of hardware such as an FPGA and an ASIC. The various functions described below can also be implemented by such hardware. Additionally, the processing circuitry 40 can implement the various functions by combining hardware processing and software processing based on its processor and programs.

The console 400 controls the entirety of the MRI apparatus 1 with these components. Specifically, the console 400 accepts imaging conditions such as the type of pulse sequence, various information, and an instruction to start imaging to be inputted by a user such as a medical imaging technologist through the input interface 43 including a mouse and a keyboard. The processing circuitry 40 causes the sequence controller 34 to perform a scan on the basis of the inputted imaging conditions and reconstructs an image on the basis of the raw data transmitted from the sequence controller 34, i.e., digitized MR signals. The reconstructed image is displayed on the display 42 and is stored in the memory 41.

Figure 2:
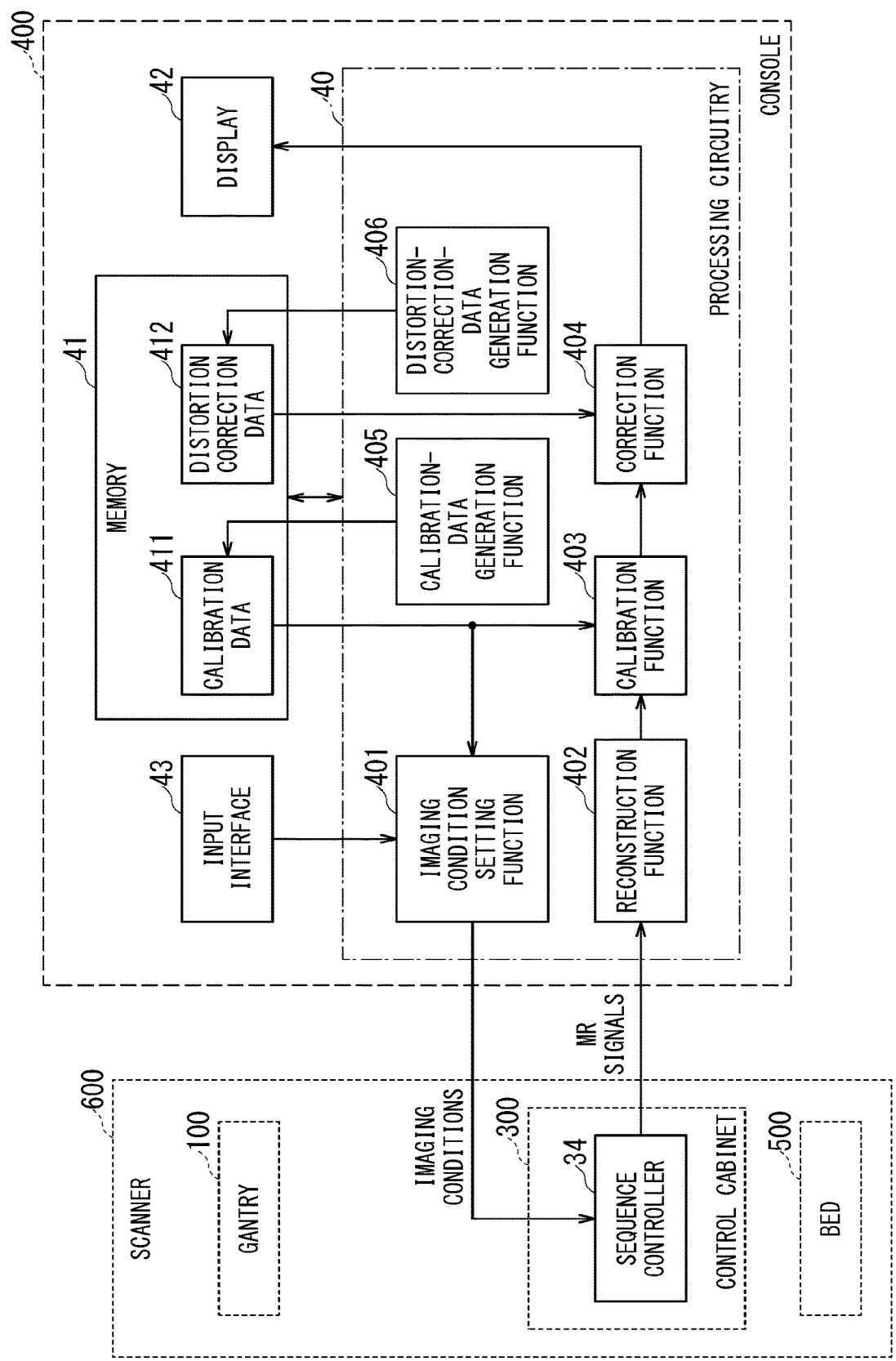
FIG. 2 is a functional block diagram mainly focusing on of processing circuitry in the MRI apparatus.

In the configuration of the MRI apparatus 1 shown in FIG. 1, the control cabinet 300, the gantry 100, and the bed 500 (i.e., all the components except the console 400) constitute an imaging unit or scanner 600 shown in FIG. 2.

FIG. 2 is a functional block diagram mainly focusing on of the processing circuitry 40 in the MRI apparatus 1. As shown in FIG. 2, the processing circuitry 40 of the MRI apparatus 1 implements an imaging condition setting function 401, a reconstruction function 402, a calibration function 403, a correction function 404, a calibration-data generation function 405, and a distortion-correction-data generation function 406. The processing circuitry 40 implements each of these functions by causing its processor to execute predetermined programs.

The imaging-condition setting function 401 receives various imaging conditions input by an operator through the input interface 43 and sets the received imaging conditions on the sequence controller 34. The imaging conditions include parameters related to the pulse sequence. The parameters related to the pulse sequence include parameters related to RF pulses output from the WB coil 12 and parameters related to gradient pulses output from the gradient coil 11.

The scanner 600 applies RF pulses and gradient pulses to the object according to the imaging conditions. The scanner 600 then acquires MR signals emitted from the object in response to these applications, and transfers the acquired MR signals to the reconstruction function 402 of the processing circuitry 40. The MR signals transferred from the scanner 600 to the reconstruction function 402 are so-called k-space data.

The reconstruction function 402 converts the k-space data into real space data by performing reconstruction processing such as inverse Fourier transform on the MR signals so as to generate a diagnostic image of the object.

The calibration function 403 calibrates the diagnostic image by using calibration data 411 stored in the memory 41. Hereinafter, the processing of the calibration function 403 will be described.

The calibration refers to processing of adjusting relationship between the size and/or position of the the imaging target depicted in the diagnostic image and the actual size and/or position of the imaging target such that the size and/or position of the former match the size and/or the position of the latter.

For example, at an arbitrary time before imaging of the object (for example, at the time of installing the MRI apparatus 1 in a facility such as a hospital), a phantom of a known size is imaged to obtain a calibration image. The known size of the phantom is used as a reference value, and data associating this reference value with the size of the phantom depicted in the calibration image are acquired as calibration data 411. In this case, the calibration data 411 are, for example, a ratio between the known size X of the phantom and the size Y of the phantom depicted in the calibration image. Such calibration data 411 are used for converting the size of a tissue and/or the distance between the tissues depicted in the reconstructed diagnostic image into the actual size of the object tissue and/or the actual distance between the tissues.

The phantom to be used for calibration may be, for example, a cube or cylinder filled with a homogeneous material or may be one in which a plurality of small markers are disposed in one phantom. In the former case, the external dimension of the phantom may be used as the calibration reference value. In the latter case, the interval between the markers may be used as the calibration reference value.

When the position of the outer edge of the phantom is used as the calibration position, the distance from the magnetic field center to the outer edge of the phantom can be used as the calibration reference value. Additionally or alternatively, when the position of a specific or selected marker among all the markers in the phantom is set as the calibration position, the distance from the magnetic field center to the position of the specific marker can be used as the calibration reference value.

Each of the above-described calibration methods is a method of adjusting the reconstructed image by software with the use of the calibration data 411. Besides this software method, a calibration method by hardware may be used. In the calibration method by hardware, adjustment of the gradient magnetic field strength while using the calibration image obtained by imaging the phantom is performed before imaging the object (for example, at the time of installing the MRI apparatus 1). The adjustment of the gradient magnetic field strength is performed by, for example, adjusting the value of the gradient magnetic field current to be supplied from the gradient magnetic field power supplies (31$x$, 31$y$, 31$z$) to the gradient coil 11. For example, the actual phantom size and/or the actual distance between the markers are used as reference values, and the value of the gradient magnetic field current is adjusted in such a manner that these reference values match the size of the phantom and/or the distance between the markers depicted in the calibration image.

The data which have been used for adjusting the gradient magnetic field current for the calibration image are stored as the calibration data 411 in the memory 41. In imaging for obtaining a diagnostic image of the object, a gradient magnetic field current reflecting the calibration data 411 is applied to the gradient coil 11 under the control of the imaging-condition setting function 401 and the sequence controller 34.

In the above-described calibration method by hardware, when the position of the outer edge of the phantom is set as the calibration position, the distance from the magnetic field center to the outer edge of the phantom can be used as the calibration reference value similarly to the calibration method by software. Further, in the above-described calibration method by hardware, when a position of one specific marker among plural markers in the phantom is selected as the calibration position, the distance from the magnetic field center to the position of the specific marker can be used as the calibration reference value similar to the calibration method by software.

Even with such a calibration method by hardware, the calibration positions of the outer edge and the specific marker of the actual phantom can be associated with the positions of the outer edge and the specific marker of the phantom depicted in the calibration image, respectively. The above-described calibration method by hardware and the calibration method by software may be used in combination as calibration processing.

The processing for acquiring the calibration data 411 and the processing for storing the calibration data 411 in the memory 41 are performed by the calibration-data generation function 405 shown in FIG. 2.

In the MRI apparatus 1 of the first embodiment, after the above-described calibration processing is performed on the diagnostic image by the calibration function 403, the correction function 404 further corrects the diagnostic image, by using the distortion correction data 412 stored in the memory 41. The distortion correction data 412 are data for correcting non-linear distortion of a gradient magnetic field such that the non-linear characteristic of the gradient magnetic field becomes a linear characteristic. In particular, in the MRI apparatus 1 of the first embodiment, the distortion correction data 412 are data for correcting the non-linear distortion of the gradient magnetic field in such a manner that the non-linear characteristic of the gradient magnetic field becomes a linear characteristic based on the gradient magnetic field at a correction reference position set at a position away from the magnetic field center of the gradient coil 11. The correction reference position may be simply referred to as "a correction position."

The distortion correction data 412 are data generated by the distortion-correction-data generation function 406 and stored in the memory 41.

Prior to more detailed descriptions of the distortion-correction-data generation function 406 and the correction function 404 of the present embodiment, a description will be given of the points to be improved in the conventional technology related to the correction of the non-linearity of the gradient magnetic field by referring to FIG. 3 and FIG. 4.

Figure 3:
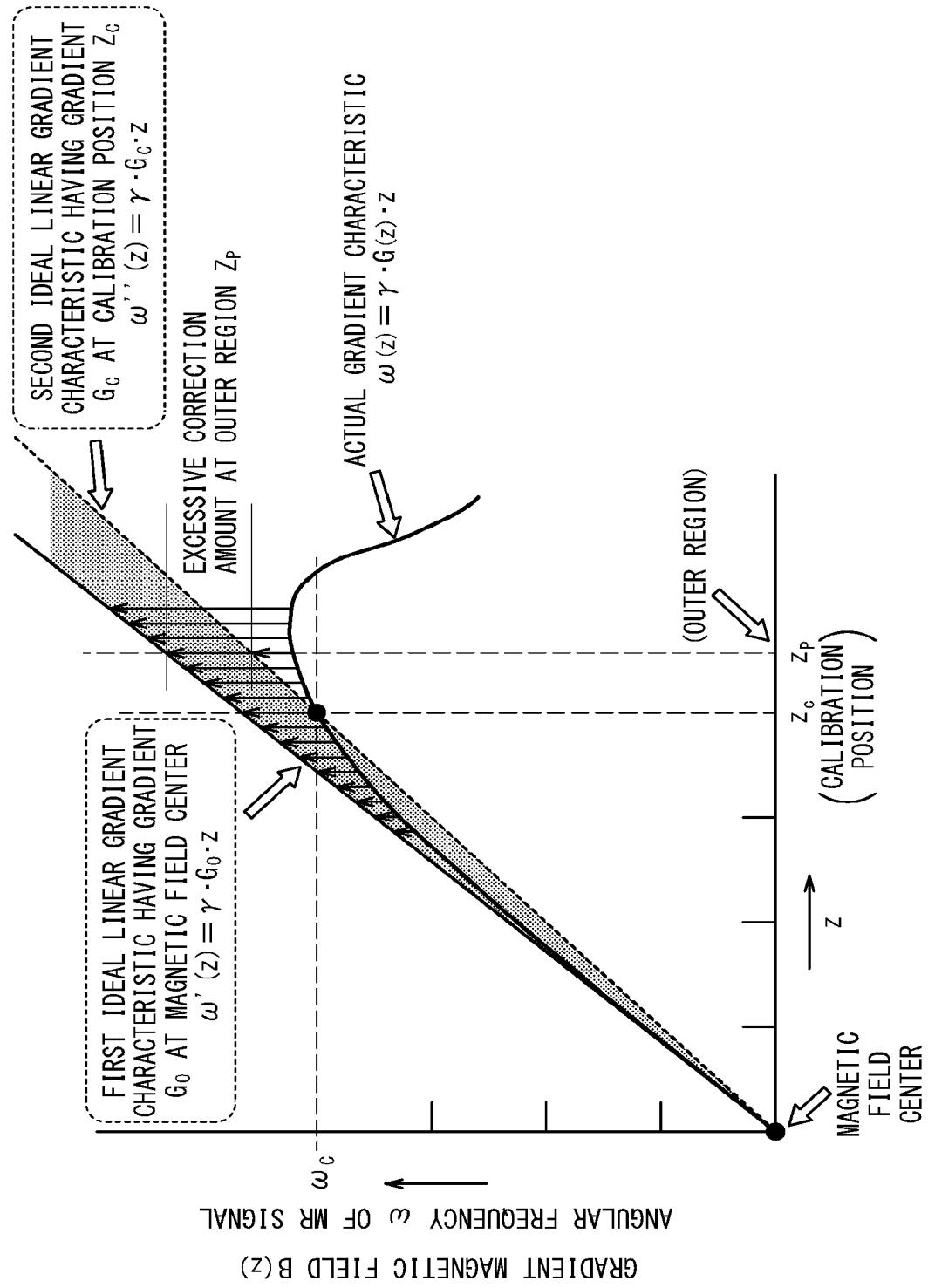
FIG. 3 is a first schematic diagram illustrating a conventional technique related to correction of non-linearity of a gradient magnetic field.

FIG. 3 is a graph in which the position of the magnetic field center is set as the origin, its horizontal axis indicates the position in the bore, and its vertical axis indicates gradient magnetic field strength. In the graph of FIG. 3, the horizontal axis indicates the position z in the Z-axis direction, and the vertical axis indicates the gradient magnetic field strength B(z) in the Z-axis direction.

In the following description, ω(z) represents the angular frequency of the MR signal caused only by the gradient magnetic field B(z), excluding the central angular frequency coo of the MR signal due to the static magnetic field $B_0$. As is well known, ω(z) can be expressed by Expression 1 and Expression 2.

$$\omega(z) = \Upsilon \cdot B(z)$$ Expression 1
$$= \Upsilon \cdot G(z) \cdot z$$ Expression 2

In Expressions 1 and 2, γ is a constant called a gyromagnetic ratio and G(z) is the gradient of the gradient magnetic field B(z) in the application direction of the gradient magnetic field B(z) (i.e., the rate of change of the strength of gradient magnetic field B(z) with respect to the Z-axis position z). In the graph of FIG. 3, the characteristic of the curve labeled as "the actual gradient magnetic field characteristic" corresponds to Expression 1 or Expression 2. Since the angular frequency ω of an MR signal is proportional to the applied gradient magnetic field B(z) as described above, the vertical axis of the graph in FIG. 3 also corresponds to the angular frequency ω of the MR signal.

Although it is ideal that the gradient G(z) of the gradient magnetic field has a constant value over a wide range, the gradient G(z) of the gradient magnetic field actually exhibits a non-linear characteristic due to physical constraints such as the size of the gradient magnetic field coil.

As shown in FIG. 3, though the gradient G(z) usually shows a substantially constant value in the vicinity of the magnetic field center, the gradient G(z) gradually decreases as the distance from the magnetic field center increases. As a whole, the characteristic of the gradient magnetic field B(z) or the gradient G(z) is non-linear.

In order to correct such a non-linear characteristic to a linear characteristic, distortion correction data such as a distortion correction table has been conventionally used. The conventional distortion correction table corrects the gradient G(z) of the gradient magnetic field B(z) in such a manner that the gradient G(z) becomes a constant value of gradient $G_0$ at the magnetic field center of the gradient magnetic field B(z) at any position in the Z-axis direction. Note that the gradient $G_0$ is a gradient at the magnetic field center of the gradient magnetic field B(z). Thus, the characteristic corrected by the distortion correction table can be expressed by, for example, Expression 3 below.

$$\omega'(z) = \gamma \cdot G_0 \cdot z$$ Expression 3

The characteristic represented by Expression 3 corresponds to the straight line indicated by the solid line in the graph of FIG. 3. In the following, the characteristic represented by Expression 3 and having the gradient $G_0$ of the gradient magnetic field at the magnetic field center is referred to as a first ideal linear gradient magnetic field characteristic.

Meanwhile, in addition to the correction using the distortion correction table, calibration using a phantom has also been performed conventionally. For example, the phantom is disposed in the bore such that the center position of the phantom matches the magnetic field center, and then calibration is performed by using the position of the outer edge of the phantom as the calibration position in the above-described manner. This calibration provides calibration data that associates the angular frequency $\omega_c$ corresponding to the position of the outer edge of the phantom in the calibration image with the calibration position $z_c$ of the actual phantom. Once the calibration data are acquired, the position (or size) on the reconstructed image can be associated with the actual position (or size) of the tissue of the object by applying this calibration data to the reconstructed image.

It should be noted that such calibration processing is nothing more than associating the angular frequency ω" (z) of the MR signal to be obtained by imaging the object with the position z with the use of Expression 4 below.

$$\omega''(z) = \gamma \cdot G_c \cdot z$$ Expression 4

In Expression 4, $G_c$ is a gradient defined by the gradient magnetic field B(z) at the calibration position $z_c$, and more precisely, $G_c$ is the ratio of the gradient magnetic field B ($z_c$) at the calibration position $z_c$ to the calibration position $z_c$. In other words, $G_c = B(z_c)/z_c$. The characteristic indicated by Expression 4 corresponds to the straight line indicated by the broken line in the graph of FIG. 3. In the following, the characteristic indicated by Expression 4 is referred to as a second ideal linear gradient magnetic field characteristic.

As described above, conventionally, the calibration processing expressed by Expression 4 and the nonlinear correction processing expressed by Expression 3 are performed. However, in the conventional processing, the slope $G_c$ of the second ideal linear gradient magnetic field characteristic (Expression 4) and the slope $G_0$ of the first ideal linear gradient magnetic field characteristic (Expression 3) are different, and thus a residual error occurs even after the correction using the distortion correction table. This residual error is caused by the difference between the slopes of the two straight lines of Expression 3 and Expression 4, and the hatched region in the graph of FIG. 3 corresponds to the residual error.

Figure 4:
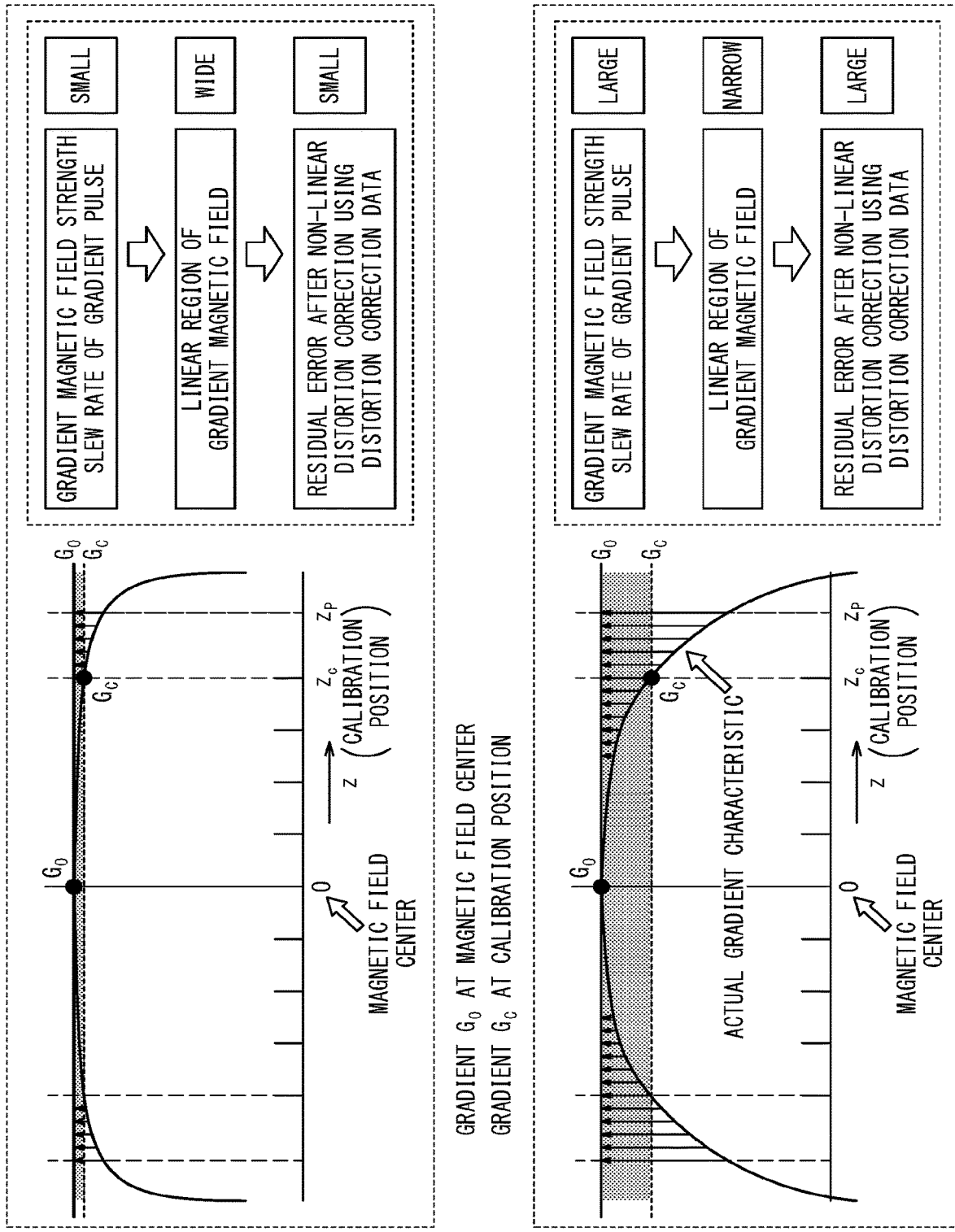
FIG. 4 is a second schematic diagram illustrating the conventional technique related to correction of non-linearity of a gradient magnetic field.

FIG. 4 schematically shows that the magnitude of this residual error changes depending on the width of the linear region of the gradient magnetic field. In each of the two graphs shown in FIG. 4, the horizontal axis indicates the position in the Z-axis direction similarly to FIG. 3 (note that FIG. 4 shows both the positive and negative regions with respect to the magnetic field center). The vertical axis in each graph of FIG. 4 indicates not the gradient magnetic field strength but the gradient (i.e., the slope) of the gradient magnetic field.

When the gradient magnetic field is not so strong and the slew rate of the gradient pulse is not so large, the range of the linear region of the gradient magnetic field is wide, i.e., the region where the gradient of the gradient magnetic field is flat is wide. As shown in the upper graph of FIG. 4. In this case, the difference between the gradient $G_0$ of the gradient magnetic field at the magnetic field center and the gradient $G_c$ at the calibration position is small, and thus the residual error after non-linear distortion correction with the use of the distortion correction table is relatively small. Note that this residual error corresponds to the difference between the gradient $G_0$ and the gradient $G_c$ indicated by the hatched area in the upper and lower graphs of FIG. 4.

Recently, however, the gradient magnetic field strength has been increased and the slew rate of gradient pulses has been increased. As a result, as shown in the lower graph of FIG. 4, the linear region of the gradient magnetic field has been narrowed. In this case, the difference between the gradient $G_0$ of the gradient magnetic field at the magnetic field center and the gradient $G_c$ at the calibration position increases, and consequently, the residual error after non-linear distortion correction with the use of the distortion correction table increases.

The foregoing is the description of the points to be improved in the conventional technology regarding the correction of non-linearity of the gradient magnetic field and the reason thereof. Hereinafter, a more detailed description will be given of operations of the first embodiment that solves these problems by referring to FIG. 5 to FIG. 8.

Figure 5:
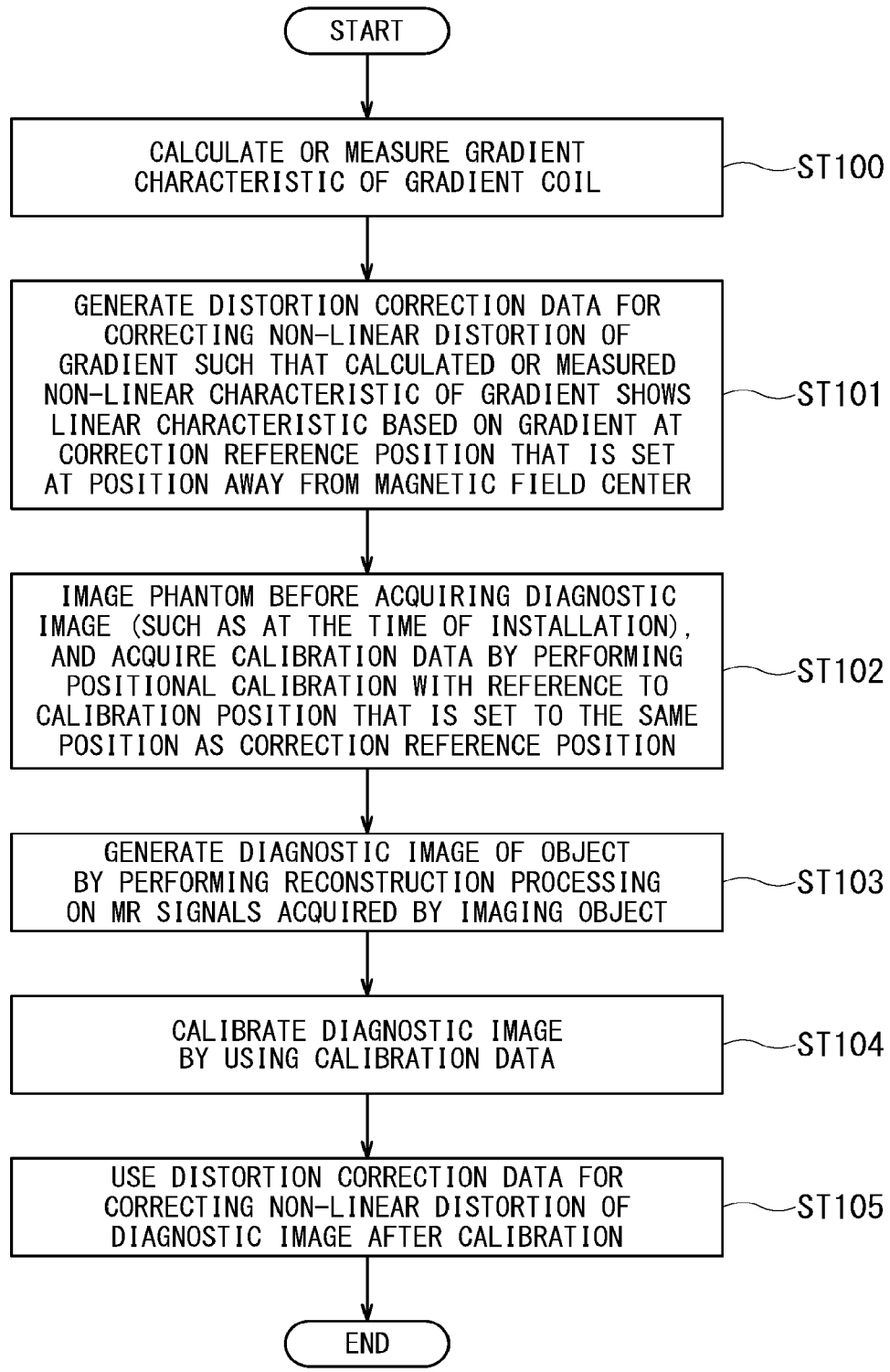
FIG. 5 is a flowchart illustrating an operation to be executed by the MRI apparatus according to the first embodiment.
Figure 6:
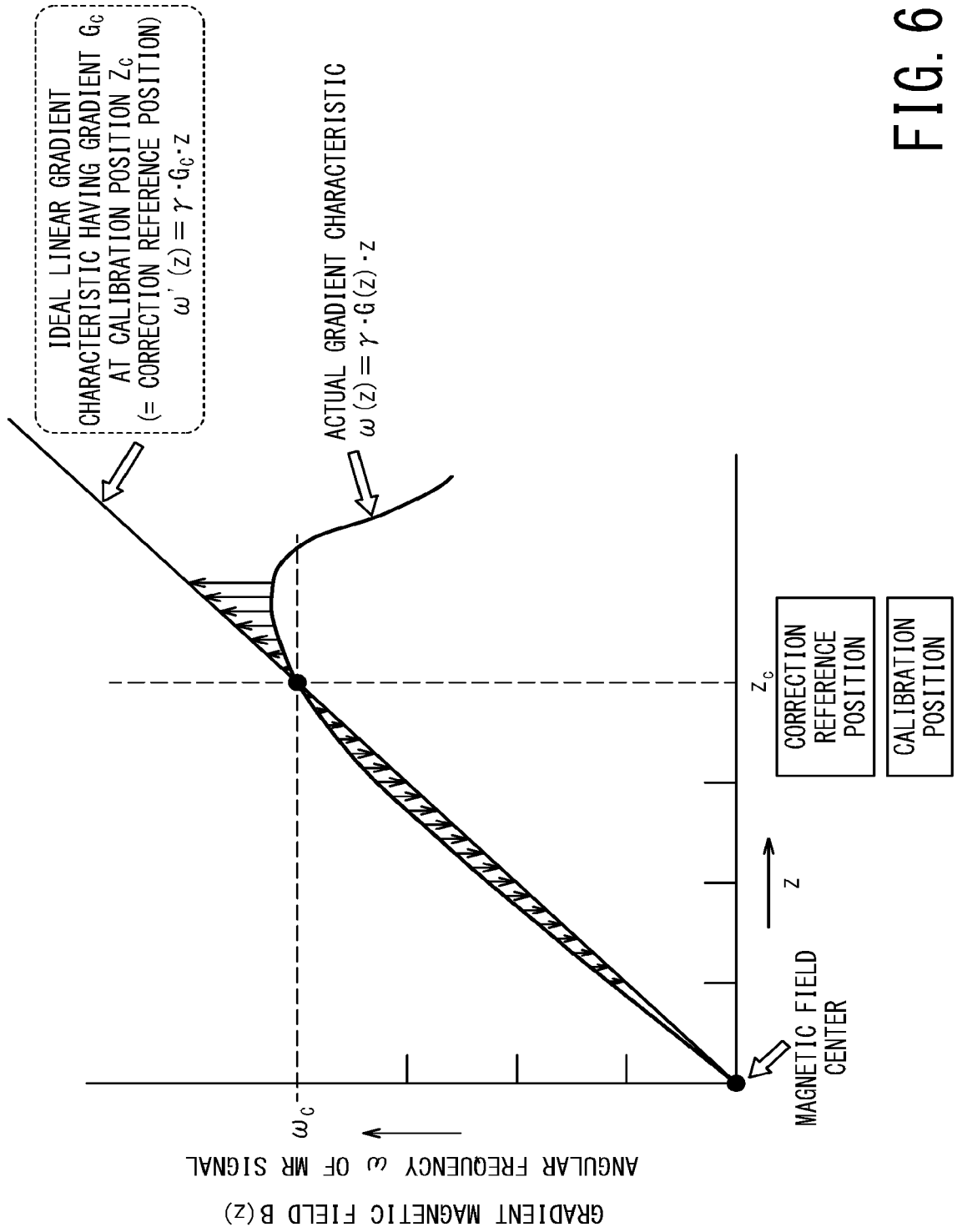
FIG. 6 is a first schematic diagram illustrating an operation concept of the MRI apparatus according to the first embodiment.
Figure 7:
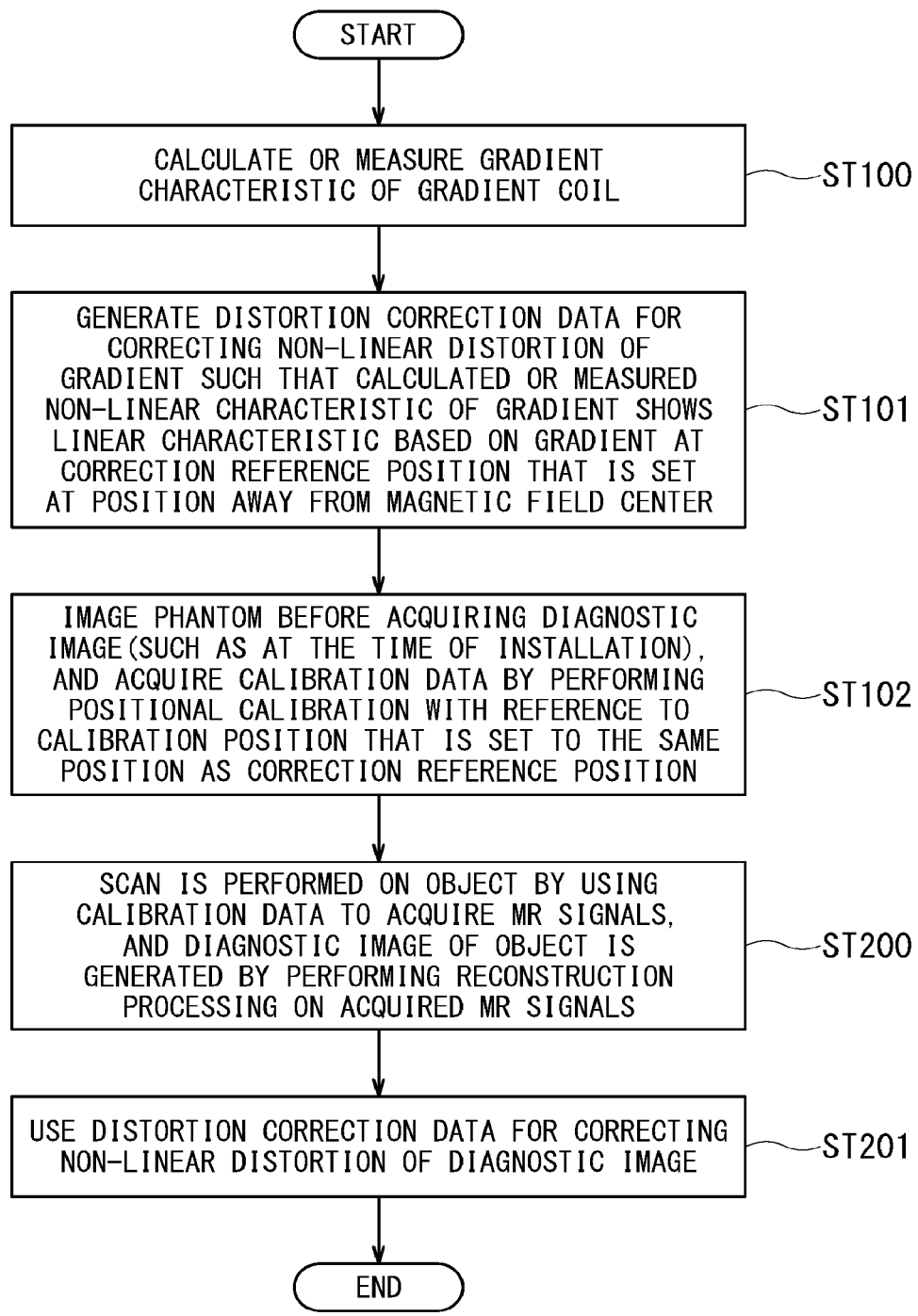
FIG. 7 is a flowchart illustrating another operation to be executed by the MRI apparatus according to the first embodiment.
Figure 8:
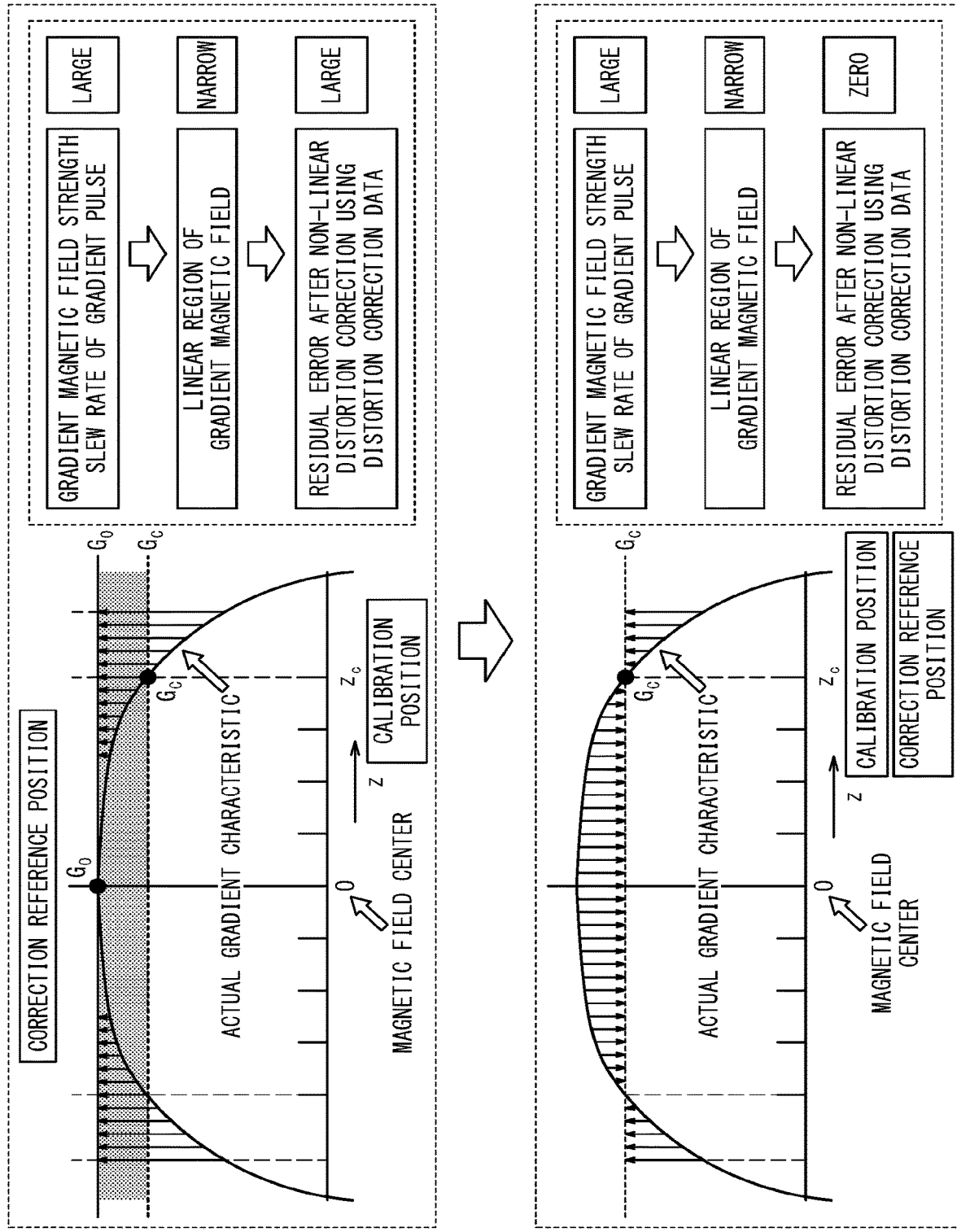
FIG. 8 is a second schematic diagram illustrating the operation concept of the MRI apparatus according to the first embodiment.

FIG. 5 and FIG. 7 are flowcharts illustrating operations to be executed by the MRI apparatus 1 according to the first embodiment. FIG. 6 and FIG. 8 are schematic diagrams illustrating the operation concept of the MRI apparatus 1.

In the step ST100 of FIG. 5, the gradient magnetic field characteristic of the gradient coil 11 is obtained by calculation or measurement. The calculated or actually measured gradient magnetic field characteristic in the step ST100 is, for example, a non-linear characteristic shown in the graph of FIG. 6. As described above, normally, this gradient magnetic field characteristic changes linearly in proportion to the distance from the magnetic field center in the vicinity of the magnetic field center but shows a non-linear characteristic, in which the gradient gradually decreases as the distance from the magnetic field center increases.

In the case of calculating the gradient magnetic field characteristic of the gradient coil 11, the gradient magnetic field characteristic is calculated on the basis of the design parameters of the gradient coil 11 such as diameter size, axial length, coil conductor size, and arrangement pattern of its coil conductor components.

In the next step ST101, the distortion correction data 412 for correcting the non-linear distortion of the gradient magnetic field are generated in such a manner that the nonlinear characteristic of the gradient magnetic field calculated or measured in the step ST100 is converted by this the distortion correction data 412 into a linear characteristic based on the gradient magnetic field at the correction reference position having been set at a position away from the magnetic field center of the gradient coil 11. The processing of the step ST101 is performed by the distortion-correction-data generation function 406.

FIG. 6 is a diagram illustrating the concept of generating the distortion correction data 412 used by the MRI apparatus 1 according to the first embodiment. The straight line extending obliquely from the origin in the graph of FIG. 6 is the linear characteristic after correction by the distortion correction data 412. This linear characteristic is a linear characteristic based on the gradient magnetic field $B(z_c)$ at the correction reference position $z_c$ that is away from the magnetic field center. The above-described "linear characteristic based on the gradient magnetic field $B(z_c)$ at the correction reference position $z_c$" is an ideal linear gradient magnetic field characteristic represented by the straight line that passes through the origin and has the slope of $G_c = B(z_c)/z_c$. Note that the slope (or the gradient) $G_c$ is equivalent to the ratio between the gradient magnetic field $B(z_c)$ at the correction reference position $z_c$ and the correction reference position $z_c$. This ideal linear gradient magnetic field characteristic is expressed by, for example, Expression 5 below.

$$\omega'(z) = \gamma \cdot G_c \cdot z \qquad \text{Expression 5}$$

The distortion correction data 412 are generated as data that cancel out the difference between the ideal linear gradient magnetic field characteristic expressed by Expression 5 and the actual non-linear gradient magnetic field characteristic expressed by Expression 2, for example.

The distortion correction data 412 may be a correction table in a format such as a lookup table, for example. Additionally, the distortion correction data 412 may be parameters of a conversion function for converting a non-linear characteristic into a linear characteristic.

Although the one-dimensional correction in the Z-axis direction has been described above for facilitating understanding, the distortion correction data 412 can be generated as three-dimensional data that correct the non-linearity of the gradient magnetic field in each direction of the X-axis, Y-axis, and Z-axis. Additionally, three-dimensional distortion correction data can be generated by providing a plurality of two-dimensional distortion correction data (for example, two-dimensional distortion correction data on the X-Y plane) in other axial directions (for example, in the Z-axis direction).

Normally, the gradient magnetic field characteristic is symmetric in the positive and negative directions of each of the X-axis, the Y-axis, and the Z-axis when viewed from the magnetic field center. Thus, for example, in the case of two-dimensional distortion correction data, the console 400 may be configured such that only the distortion correction data in the first quadrant are calculated and stored in advance so as to be applied to the other three quadrants.

In the next step ST102, at the time before acquiring a diagnostic image, for example, at the time of installing the MRI apparatus 1 in a facility such as a hospital, a phantom is imaged, then calibration is performed by using the acquired image of the phantom with reference to the calibration position that is set to the same position as the above-described correction reference position, and then calibration data are acquired.

Since the calibration processing in the step ST102 has already been described as the function performed by the calibration function 403 and is substantially the same as the conventional calibration processing, its detailed description is omitted.

As to the processing in the step ST102, it has been described that "a phantom is imaged, then calibration is performed by using the acquired image of the phantom with reference to the calibration position that is set to the same position as the above-described correction reference position". However, the calibration position in the calibration processing using the phantom (for example, the position of the outer edge of the phantom and the position of the marker in the phantom) is usually fixed for each phantom and cannot be changed. Thus, actually, the calibration position is not set at the same position as the correction reference position but the correction reference position for generating the distortion correction data is set so as to match the calibration position determined for each phantom.

From the viewpoint of calibration accuracy and/or distortion correction accuracy, it is preferred that each of the calibration position and the correction reference position is set at a position at least 7 centimeters away from the magnetic field center.

The step ST103 and the subsequent steps are processing for obtaining a diagnostic image in a usual manner.

In the step ST103, a diagnostic image, i.e., a diagnostic image before calibration/correction, of the object is reconstructed on the basis of the MR signals acquired by the scan. The processing of the step ST103 is performed by the reconstruction function 402.

In the next step ST104, the diagnostic image is calibrated by using the calibration data acquired in the step ST102. The processing of the step ST104 is performed by the calibration function 403.

In the step ST105, the distortion correction data generated in step ST101 are used to correct the non-linear distortion of the diagnostic image after the calibration. The processing of the step ST105 is performed by the correction function 404.

The flowchart shown in FIG. 5 corresponds to one case of processing that corresponds to the above-described calibration method by software. In this case, the calibration data acquired in the step ST102 are data that associate the actual size of the phantom with the size of the phantom depicted in the calibration image, and the calibration data are, for example, the ratio between the actual size of the phantom and the size of the phantom depicted in the calibration image.

On the other hand, as described above, the MRI apparatus 1 can also perform calibration processing by hardware. FIG. 7 is a flowchart illustrating the calibration processing by hardware. The processing from the steps ST100 to ST102 in FIG. 7 is substantially the same as that in FIG. 5 and duplicate description is omitted.

Note that the position calibration processing in the step ST102 is performed by adjusting the gradient magnetic field current and thereby calibrating the value of the gradient magnetic field strength. Thus, the calibration data acquired in the step ST102 are data related to the adjustment value of the gradient magnetic field current.

In the step ST200 subsequent to the step ST102, MR signals are acquired by performing a scan on the object with the use of the calibration data. That is, MR signals are acquired by applying RF pulses together with the calibrated gradient magnetic fields based on the calibration data that have been acquired in the step ST102. Afterward, a diagnostic image of the object is reconstructed on the basis of the acquired MR signals.

Since the diagnostic image reconstructed in the step ST200 is an image on which position calibration has already been performed, it is not necessarily required to execute the processing of the step ST104 in FIG. 4 (i.e., the software-based processing of correcting the diagnostic image by using the calibration data).

In the step ST201, the distortion of the diagnostic image reconstructed in the step ST200 is corrected by using the distortion correction data generated in the step ST101. The processing of the step ST200 is performed by the correction function 404.

Although the operation in FIG. 5 and the operation in FIG. 7 are different in calibration processing method, both are the same as each other in terms of performing the processing of correcting the non-linear distortion in association with the calibration processing. Thus, the same advantageous technical effects can be obtained by adopting either the operation in FIG. 5 or the operation in FIG. 7.

FIG. 8 is a schematic diagram illustrating the technical effects of the correction processing for the non-linear distortion in the first embodiment as compared with the conventional correction processing for the non-linear distortion. The upper graph of FIG. 8 is substantially the same as the lower graph of FIG. 4.

In the conventional correction processing for non-linear distortion, position calibration using a phantom is performed with reference to the calibration position $z_c$ away from the magnetic field center, while distortion correction data for correcting the non-linearity of the gradient magnetic field are generated with reference to the gradient of the gradient magnetic field at the magnetic field center. That is, in the conventional correction processing for non-linear distortion, the correction reference position used for the distortion correction is different from the calibration position serving as the reference for the calibration processing. For this reason, the gradient $G_c$ of the ideal linear gradient magnetic field characteristic used in the calibration processing is not equal to the gradient $G_0$ of the ideal linear gradient magnetic field characteristic used in the distortion correction processing. As a result, after the non-linear distortion correction, a residual error occurs due to the difference in gradient between both.

This residual error cannot be ignored as the gradient magnetic field strength or the slew rate of the gradient magnetic field pulse increases.

In the correction processing for non-linear distortion according to the first embodiment, as shown in the lower part of FIG. 8, the distortion correction data are generated in such a manner that the correction reference position used for the distortion correction coincides with the calibration position serving as the reference of the calibration processing. Thus, the gradient $G_c$ of the ideal linear gradient magnetic field characteristic used in the calibration processing becomes equal to the gradient $G_c$ of the ideal linear gradient magnetic field characteristic after the distortion correction processing. Consequently, after the nonlinear distortion correction, the residual error due to the difference in gradient between both can be made substantially zero.

Note that in the conventional non-linear distortion correction processing, across the almost whole region except the magnetic field center, the gradient of the gradient magnetic field is increased, as shown in the upper part of FIG. 8. By contrast, according to the first embodiment of the nonlinear distortion correction processing, the gradient of the gradient magnetic field is partially increased and partially decreased depending on the position, as shown in the lower part of FIG. 8 (or FIG. 6). In detail, the diagnostic image is corrected in the first region from the magnetic field center to the correction reference position by equivalently reducing the gradient of the gradient magnetic field, while being corrected in the second region further away from the magnetic field center beyond the correction reference position by equivalently increasing the gradient of the gradient magnetic field. Thus, according to the correction processing of the first embodiment, in addition to that the residual error becomes substantially zero, the magnitude of the absolute value of the correction amount at a position away from the magnetic field center can be reduced as compared with the conventional method.

Thus, according to the MRI apparatus 1 and the MRI method of the first embodiment, even when the linear region of the gradient magnetic field is narrowed by increasing the gradient magnetic field strength or increasing the slew rate of gradient pulses, the non-linear distortion correction processing using the distortion correction data ensures linearity of the gradient magnetic field over a wider range than the conventional method.

In the above-described embodiment, the distortion-correction-data generation function 406 performs processing of generating and storing the distortion correction data and the correction function 404 performs processing of correcting a diagnostic image by using the distortion correction data. However, these two functions 404 and 406 may be integrated so that the correction function 404 generates the distortion correction data and corrects the diagnostic image by using the generated distortion correction data.

Although a description has been given of the case where the non-linear distortion of the gradient magnetic field is corrected in the real space so far, the distortion correction processing can also be performed in k-space. In this case, the distortion-correction-data generation function 406 or the correction function 404 generates the distortion correction data, by which the non-linear characteristic of the gradient magnetic field is corrected into a linear characteristic, on k-space, and then the correction function 404 uses the generated distortion correction data on k-space for correcting phase of each MR signal before reconstruction processing. Thereafter, the reconstructed function 402 performs the reconstruction processing on the basis of the corrected MR signals so as to obtain a diagnostic image in which distortion due to the nonlinear characteristic of the gradient magnetic field is corrected.

Figure 9:
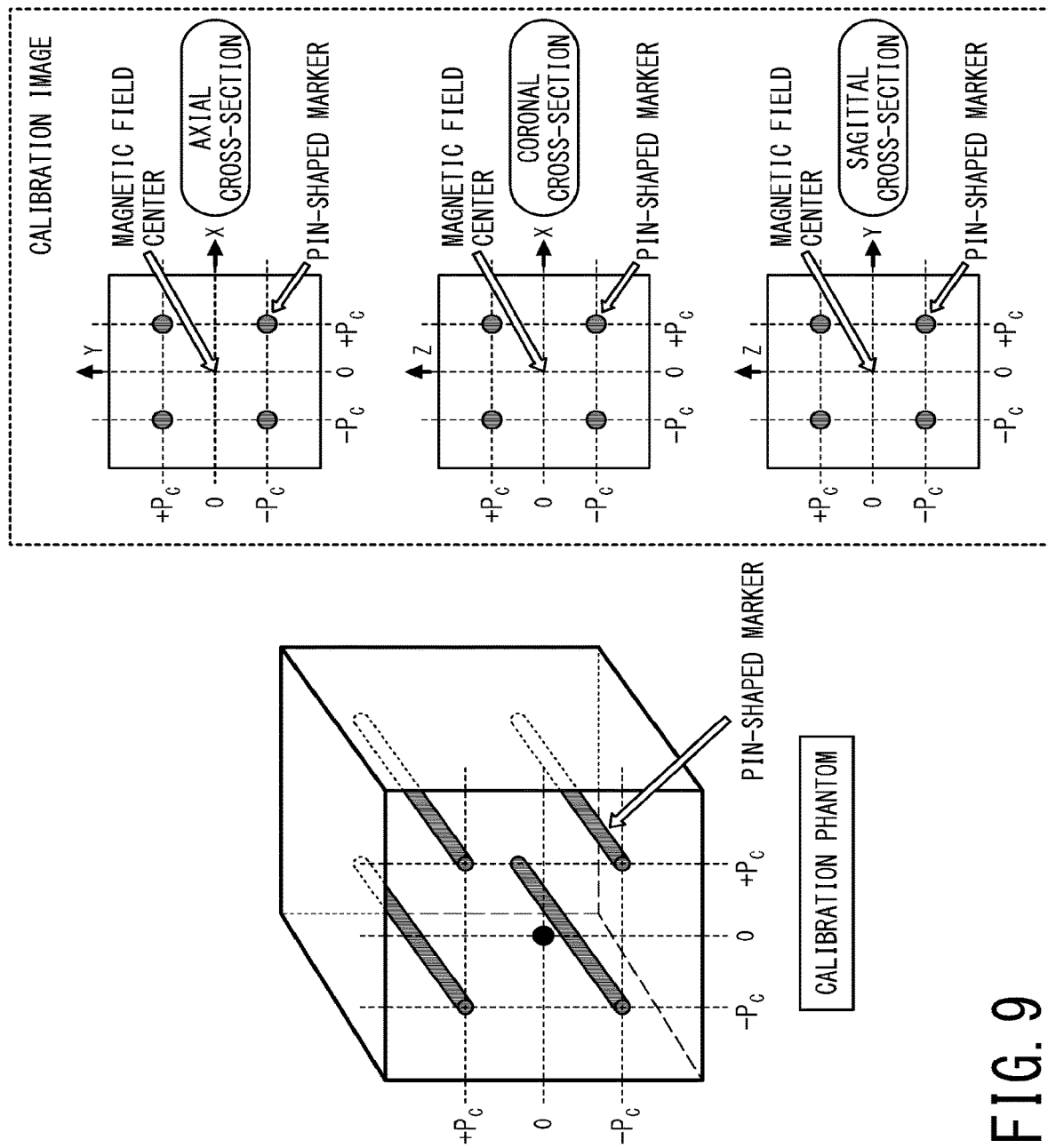
FIG. 9 is a schematic diagram illustrating a calibration phantom to be used in the MRI apparatus of the first embodiment.

FIG. 9 is a schematic diagram illustrating a calibration phantom to be used for the MRI apparatus 1 according to the first embodiment. This calibration phantom is configured to have a plurality of (four in the case of FIG. 9) thin pin-shaped markers inside a cubic case. Each pin-shaped marker is disposed at a position separated from the center of the phantom by distance Pc, for example.

Depending on the type of material filled inside the respective pin-shaped markers and the type of material filled outside the pin-shaped markers, for example, the calibration phantom can be configured such that MR signals are emitted only from the pin-shaped markers, while no MR signals are emitted from the outside of the pin-shaped markers.

Conversely, depending on the type of material described above, the calibration phantom can also be configured such that MR signals are emitted from the entire cubic region excluding the respective regions of the pin-shaped markers. In either case, when observing from a direction parallel to the axis of each pin-shaped marker, each pin-shaped marker is pinpointed so as to be depicted in the form of a dot, and thus position calibration can be performed with high accuracy.

When the calibration processing is performed, the calibration phantom is disposed in such a manner that the center of the calibration phantom is located at the magnetic field center and the axial direction of each pin-shaped marker becomes perpendicular to the imaging cross-section of the calibration image. With such disposition of the calibration phantom, each pin-shaped marker is depicted in a dot shape in the calibration image.

In the case of calibrating the position in each of the X-axis, Y-axis, and Z-axis directions, as illustrated in the right part of FIG. 9, at least three cross-sectional calibration images are acquired by setting the axial direction of each pin-shaped marker to one of the X-axis, Y-axis, and Z-axis directions. For example, a calibration image of an axial cross-section (X-Y plane), a calibration image of a coronal cross-section (X-Z plane), and a calibration image of a sagittal cross-section (Y-Z plane) are acquired by setting the axial direction of all the pin-shaped markers to the X-axis, the Y-axis, and the Z-axis, respectively, and then calibration is performed by using the acquired three calibration images. In the case of FIG. 9, the distance Pc from the center position of the phantom disposed at the magnetic field center to each pin-shaped marker becomes the above-described calibration position for any axis. Thus, the correction reference position serving as the reference for generating the distortion correction data is also a position separated from the magnetic field center by the distance Pc.

Second Embodiment

Figure 10:
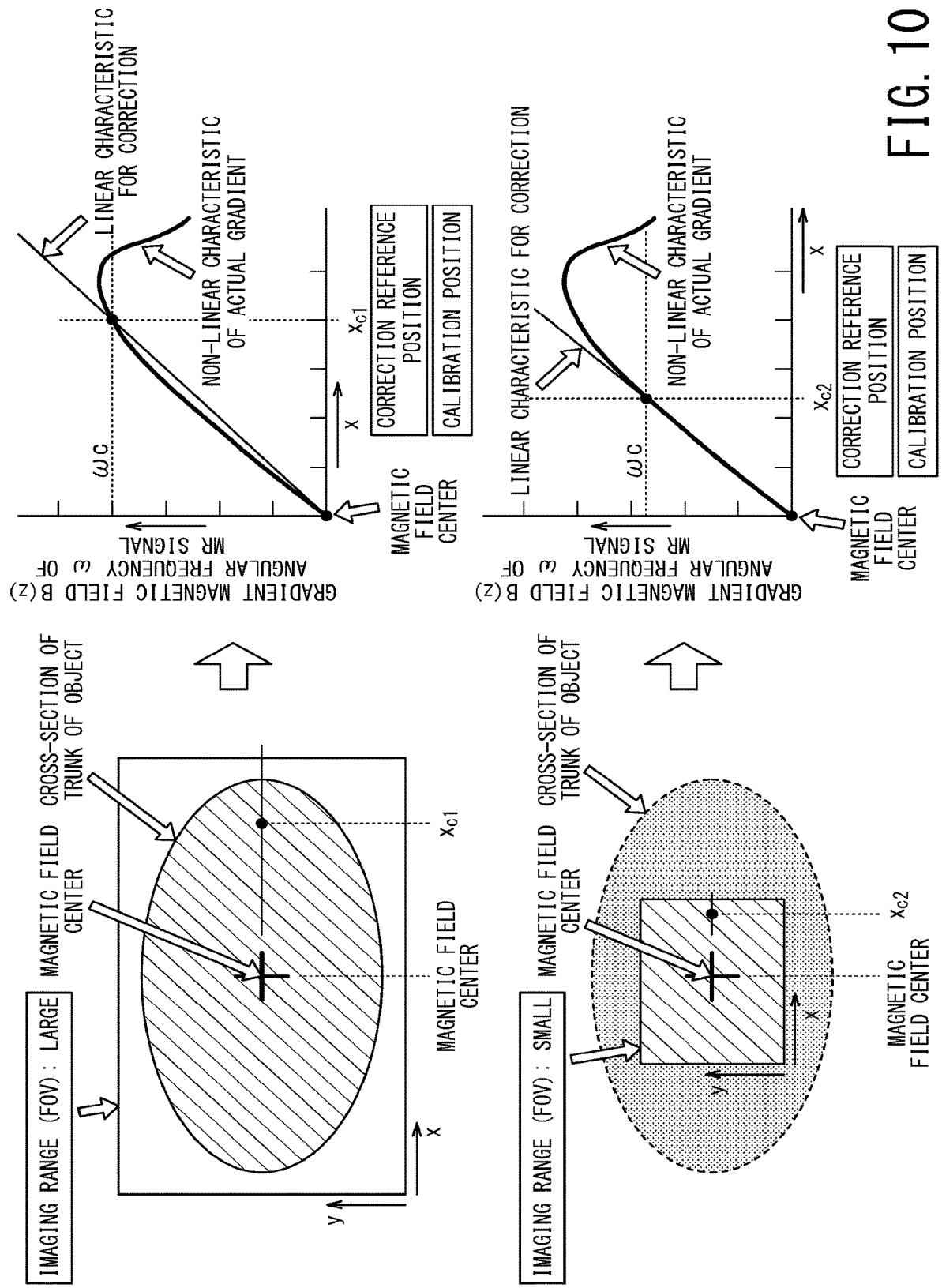
FIG. 10 is a schematic diagram illustrating an operation concept of the MRI apparatus according to the second embodiment.

FIG. 10 is a schematic diagram illustrating an operation concept of the MRI apparatus 1 according to the second embodiment. As in the first embodiment, the correction reference position is set at the same position as the calibration position in the second embodiment as well. Although, in the first embodiment, the correction reference position is a predetermined fixed position separated away from the magnetic field center (for example, a position separated away from the magnetic field center by 7 centimeters or more), the second embodiment differs from the first embodiment in that the correction reference position is changed depending on the conditions of a range of an imaging region, for example, depending on the size of FOV (Field of View).

The upper left of FIG. 10 illustrates a case where a large imaging range is set and the ellipse in the upper left of FIG. 10 schematically shows an axial cross-section of the trunk of the object. In the case of imaging the entire trunk, the imaging range is set to be relatively large. In such a case, as illustrated in the upper right of FIG. 10, the correction reference position Xc1 is set at a position that is relatively far from the magnetic field center, for example, at a position away from the magnetic field center by at least 15 cm in the X-axis direction.

The lower left of FIG. 10 illustrates a case where a small imaging range is set. For example, it is assumed that only the central part of the trunk of the object is imaged. In such a case, as illustrated in the lower right of FIG. 10, the correction reference position Xc2 is set at a position that is relatively close to the magnetic field center, for example, at a position about 7 cm away from the magnetic field center in the X-axis direction.

When the correction reference position is close to the magnetic field center, the actual gradient magnetic field characteristic also approaches the linear characteristic. For this reason, as shown in the lower right of FIG. 10, the difference between the linear characteristic for correction and the non-linear characteristic of the actual gradient magnetic field is reduced, and the correction amount is also reduced.

When the correction processing is ideally performed, the non-linear characteristic of the actual gradient magnetic field completely matches the linear characteristic for correction, and the error (i.e., residual error) after the correction processing becomes zero as described above. However, in practice, the case where correction is ideally performed is rare. Even if it is a small value, some non-zero residual error occurs after the correction processing. In practice, some non-zero residual error occurs after correction processing, regardless of whether the residual error becomes a non-negligible value or a negligibly small value. This residual error is considered to be smaller as the correction amount is smaller.

In other words, when the imaging range (FOV) is sufficiently small and thus a region where the gradient magnetic field characteristic is close to a linear characteristic can be used, the residual error can be reduced by setting the correction reference position to a position close to the magnetic field center as in the case shown in the lower part of FIG. 10.

On the other hand, when the imaging range (FOV) is large and thus it is unavoidable to use not only the ideal region close to the magnetic field center but also a non-linear region where the gradient magnetic field characteristic is non-linear to some extent, the correction reference position is set at a position further away from the magnetic field center as in the upper case in FIG. 10 and the residual error may increase.

In the second embodiment, the correction reference position can be changed depending on the size of the imaging range (FOV). Thus, the second embodiment can avoid an undesirable case where the residual error is increased by setting the correction reference position to a position unnecessarily farther from the magnetic field center, notwithstanding the smallness of the imaging region (FOV).

Third Embodiment

Figure 11:
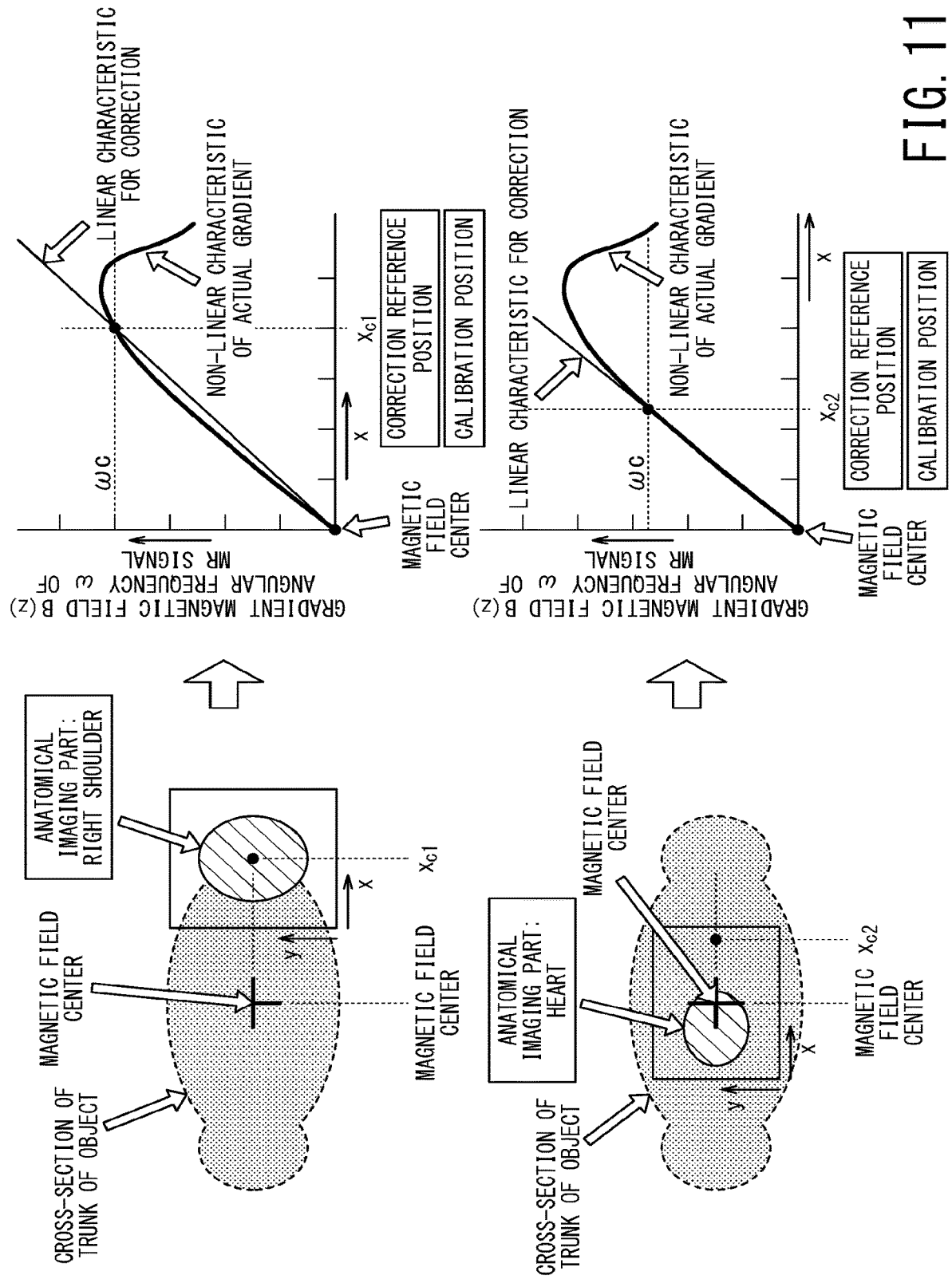
FIG. 11 is a schematic diagram illustrating an operation concept of the MRI apparatus according to the third embodiment.

FIG. 11 is a schematic diagram illustrating an operation concept of the MRI apparatus 1 according to the third embodiment. Also in the third embodiment, the correction reference position and the calibration position are set at the same position similarly to the first and second embodiments. In the third embodiment, the correction reference position is changed depending on the anatomical imaging part of the object. The anatomical imaging part of the object refers to the organ (for example, the lung, the stomach, the heart, or so forth) of the object as the imaging target and/or the body part (for example, the head, the lower limbs, the right shoulder, the left shoulder, the right arm, the left arm, or so forth) of the object as the imaging target.

Each of the upper left and lower left of FIG. 11 schematically illustrates an axial cross-section of the object similarly to the upper left and lower left of FIG. 10. The upper left of FIG. 11 shows a case where the right shoulder is set as the anatomical imaging part. In the case of imaging the right shoulder, the correction reference position is desirably set such that the error in the region centered on the right shoulder is reduced. For this reason, as shown in the upper right of FIG. 11, the correction reference position is set to the position away from the magnetic field center by Xc1 on the right side in the X-axis direction. Such setting of the correction reference position can reduce the residual error around the right shoulder.

The lower left of FIG. 11 shows a case where the heart is set as the anatomical imaging part. In the X-axis direction, the heart is usually included in a region near the magnetic field center. Thus, in such a case, the correction reference position is set to a position (Xc2) close to the magnetic field center in the X-axis direction. Such setting of the correction reference position can reduce the residual error in the case of cardiac imaging.

Since the correction reference position can be changed depending on the anatomical imaging part of the object in the above-described third embodiment, the distortion due to the non-linear characteristic of the gradient magnetic field can be minimized depending on the anatomical imaging part.

Fourth Embodiment

Figure 12:
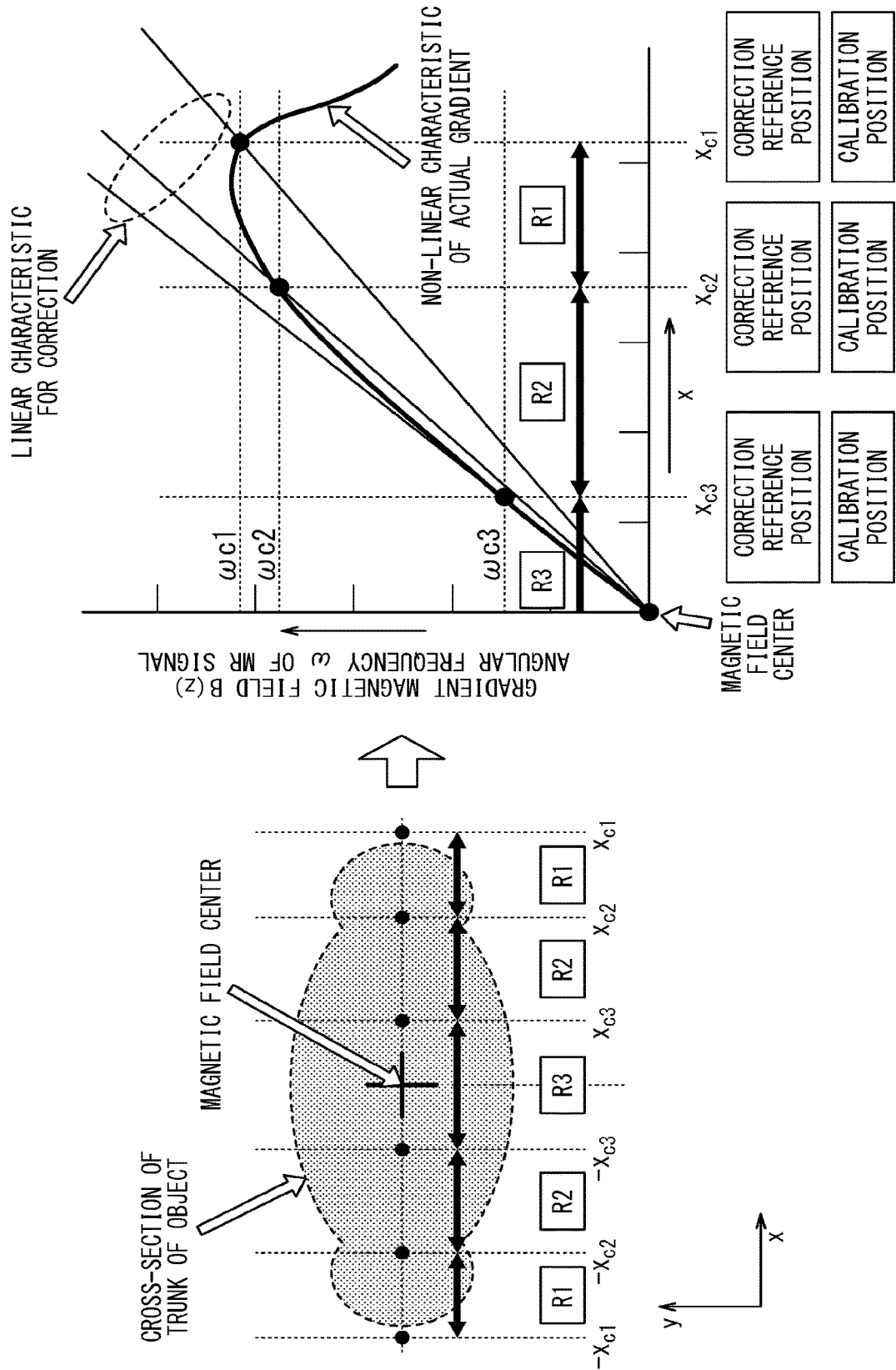
FIG. 12 is a schematic diagram illustrating an operation concept of the MRI apparatus according to the fourth embodiment.

FIG. 12 is a schematic diagram illustrating an operation concept of the MRI apparatus 1 according to the fourth embodiment. Also in the fourth embodiment, the correction reference position and the calibration position are set at the same position similarly to the first to third embodiments. In the fourth embodiment, two or more correction reference positions are set and a plurality of linear characteristics for the correction processing are calculated for the respective correction reference positions. The distortion correction data are individually generated for each of the correction reference positions such that the non-linear characteristic of the gradient magnetic field at each position matches each of the plurality of linear characteristics. That is, the distortion correction data (for example, a distortion correction lookup table) are generated for each of the correction reference positions.

In the case shown in the right part of FIG. 12, three sets of distortion correction data are generated such that the first distortion correction data corresponds to the correction reference position Xc1, the second distortion correction data corresponds to the correction reference position Xc2, and the third distortion correction data corresponds to the correction reference position Xc3. These three sets of distortion correction data are individually used to correct a reconstructed diagnostic image. As a result, three corrected diagnostic images are obtained from one original diagnostic image so as to correspond to the respective three sets of distortion correction data.

As can be inferred from the description of the second and third embodiments, for the region R1 farthest from the magnetic field center in the left part of FIG. 12, the diagnostic image corrected by using the first distortion correction data corresponding to the correction reference position Xc1 has the least distortion.

For the region R3 closest to the magnetic field center, the diagnostic image corrected by using the third distortion correction data corresponding to the correction reference position Xc3 has the least distortion.

For the region R2 between the region R1 and the region R3, the diagnostic image corrected by using the second distortion correction data corresponding to the correction reference position Xc2 has the least distortion.

In the fourth embodiment, two or more sets of distortion correction data are generated by setting two or more correction reference positions such that the same number of distortion-corrected diagnostic images as the number of sets of distortion correction data are obtained from one original diagnostic image before correction processing. As a result, a user can select a diagnostic image with the least distortion in the region of interest from the plurality of corrected diagnostic images.

Image Processing Apparatus

Figure 13:
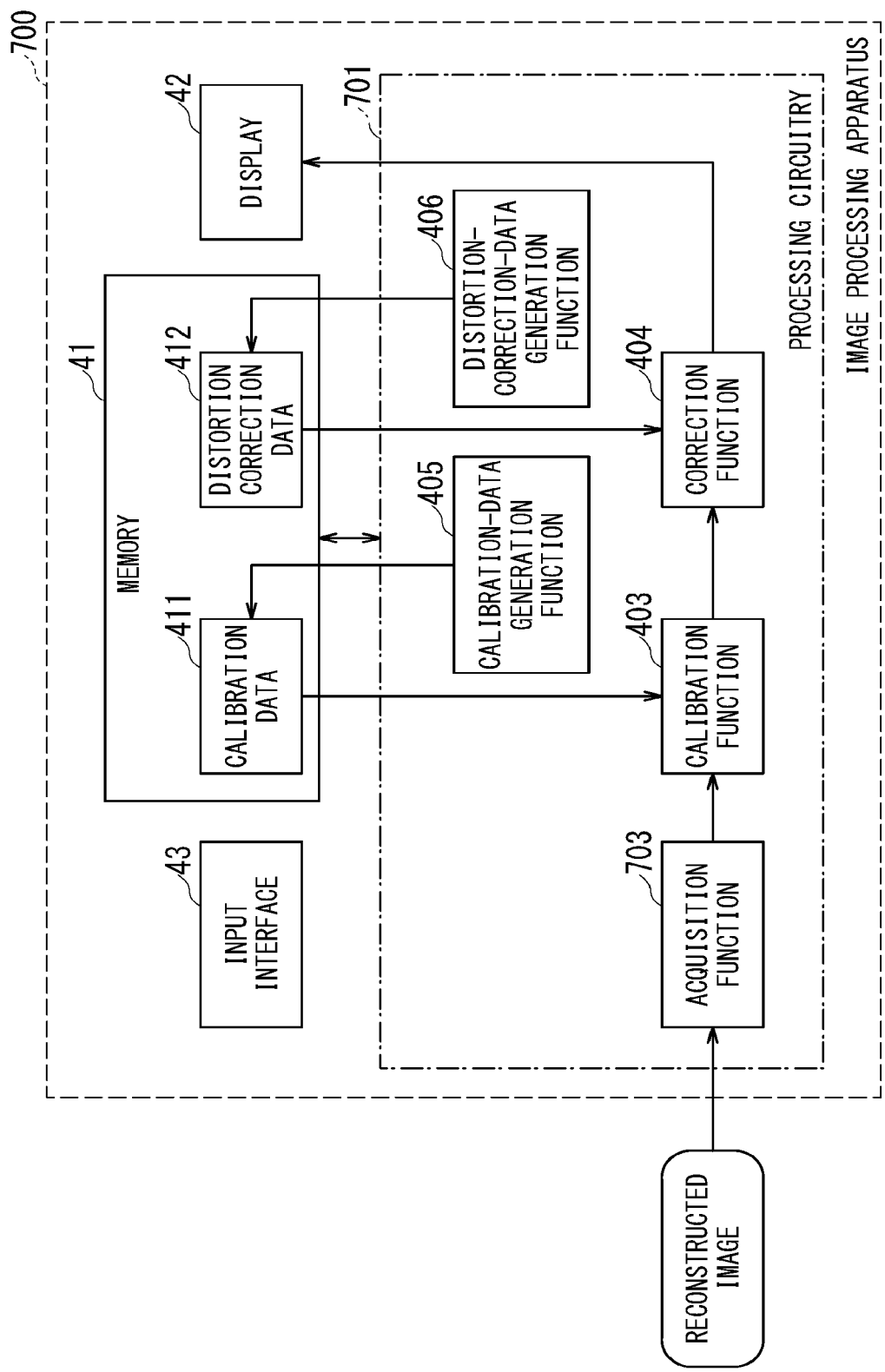
FIG. 13 is a functional block diagram of an image processing apparatus according to one embodiment.

FIG. 13 is a functional block diagram of an image processing apparatus 700 according to one embodiment. The image processing apparatus 700 differs from the MRI apparatus 1 shown in FIG. 2 in that the image processing apparatus 700 does not include the scanner 600 for acquiring MR signals. Further, the image processing apparatus 700 does not include the reconstruction function 402 for reconstructing an image from MR signals or the imaging-condition setting function 401 for setting imaging conditions on the scanner 600.

Instead, processing circuitry 701 of the image processing apparatus 700 includes an acquisition function 703 for acquiring a reconstructed image before correction. Since the other functions of the processing circuitry 701 are the same as the functions of the MRI apparatus 1, i.e., the calibration function 403, the correction function 404, the calibration-data generation function 405, and the distortion-correction-data generation function 406 are common to both, duplicate description is omitted.

The image processing apparatus 700 can obtain substantially the same technical effects as those of each embodiment of the MRI apparatus 1.

As described above, the MRI apparatus and the image processing apparatus of each embodiment can appropriately correct the image distortion that is caused by non-linearity of the gradient magnetic field to be generated by the gradient coil.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An MRI apparatus comprising:
a scanner that is provided with at least an RF coil and a gradient coil and is configured to acquire a magnetic resonance (MR) signal emitted from an object in response to applications of an RF pulse outputted from the RF coil and a gradient magnetic field generated by the gradient coil; and
processing circuitry configured to
reconstruct a diagnostic image of the object based on the MR signal,
generate distortion correction data for correcting a non-linear characteristic of the gradient magnetic field to a linear characteristic that is defined by gradient magnetic field strength at a correction position away from a magnetic field center of the gradient coil and distance from the magnetic field center to the correction position, and
correct the diagnostic image by using the distortion correction data,
wherein the processing circuitry is further configured to calculate the non-linear characteristic of the gradient magnetic field based on design parameters of the gradient coil.

2. The MRI apparatus according to claim 1, wherein the processing circuitry is further configured to change the correction position depending on a range of an imaging region.

3. The MRI apparatus according to claim 1, wherein the processing circuitry is configured to change the correction position depending on an anatomical imaging part of the object.

4. The MRI apparatus according to claim 1, wherein the processing circuitry is further configured to:
generate two or more sets of distortion correction data corresponding to respective two or more correction positions that are away from the magnetic field center, wherein, with each of the two or more sets of distortion correction data, a non-linear characteristic of the gradient magnetic field at a corresponding correction position is each corrected to become linear characteristic, the linear characteristic being each defined by gradient magnetic field strength at the corresponding correction position and distance from the magnetic field center to the corresponding correction position; and
correct the diagnostic image by individually applying the two or more sets of distortion correction data to the diagnostic image to generate respective two or more corrected images.

5. The MRI apparatus according to claim 1, wherein the processing circuitry is further configured to
correct the diagnostic image by using the distortion correction data in such a manner that a gradient of the gradient magnetic field is equivalently reduced in a first region and is equivalently increased in a second region,
wherein the first region is a region from the magnetic field center to the correction position, and the second region is a region further away from the gradient magnetic field center beyond the correction position.

6. The MRI apparatus according to claim 1, wherein the processing circuitry is further configured to generate the diagnostic image as an image that is calibrated with reference to a calibration position set at a same position as the correction position.

7. The MRI apparatus according to claim 6, wherein the processing circuitry is further configured to calibrate the diagnostic image by using a calibration image that is obtained by imaging a phantom.

8. The MRI apparatus according to claim 7, wherein:
the calibration position is a position of a marker disposed inside the phantom; and
the processing circuitry is further configured to calibrate size of the diagnostic image by using previously acquired calibration data that associate the calibration position with a position of the marker depicted in the calibration image based on the calibration image obtained by imaging the phantom before imaging of the object.

9. The MRI apparatus according to claim 7, wherein:
the calibration position is a position of a marker disposed inside the phantom; and
the processing circuitry is further configured to cause the scanner to adjust gradient magnetic field strength by using the calibration image before imaging the object in such a manner that the calibration position and a position of the marker depicted in the calibration image are associated with each other.

10. The MRI apparatus according to claim 7, wherein:
the phantom includes a marker that is pin-shaped; and
the phantom is disposed at a time of imaging the phantom in such a manner that an axial direction of the marker is orthogonal to an imaging cross-section of the calibration image and the marker is depicted as a dot in the calibration image.

11. The MRI apparatus according to claim 6, wherein the processing circuitry is further configured to set the calibration position at a position away from the magnetic field center by at least 7 centimeters.

12. An image processing apparatus comprising processing circuitry configured to:
acquire a diagnostic image of an object, the diagnostic image being reconstructed by an MRI apparatus;
generate distortion correction data for correcting a non-linear characteristic of a gradient magnetic field to be generated by a gradient coil of the MRI apparatus to a linear characteristic that is defined by gradient magnetic field strength at a correction position away from a magnetic field center of the gradient coil and distance from the magnetic field center to the correction position; and correct the diagnostic image by using the distortion correction data,
wherein the processing circuitry is further configured to calculate the non-linear characteristic of the gradient magnetic field based on design parameters of the gradient coil.

13. An MRI method comprising:

generating distortion correction data for correcting a non-linear characteristic of a gradient magnetic field generated by a gradient coil to a linear characteristic that is defined by gradient magnetic field strength at a correction reference position away from a magnetic field center of the gradient coil and distance from the magnetic field center to the correction reference position;

generating a calibration image by imaging a phantom;

performing position calibration at a calibration position of a marker inside the phantom depicted in the calibration image, the calibration position being a same position as the correction reference position;

acquiring a magnetic resonance (MR) signal emitted from an object by applying an RF pulse and the gradient magnetic field to the object after the position calibration;

reconstructing a diagnostic image of the object based on the MR signal; and correcting the diagnostic image by using the distortion correction data, wherein the processing circuitry is further configured to calculate the non-linear characteristic of the gradient magnetic field based on design parameters of the gradient coil.

* * * * *